(12) United States Patent
Honda

(10) Patent No.: US 12,464,712 B2
(45) Date of Patent: Nov. 4, 2025

(54) ELECTRONIC CIRCUIT DEVICE

(71) Applicant: Murata Manufacturing Co., Ltd., Kyoto (JP)

(72) Inventor: Keiichi Honda, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 384 days.

(21) Appl. No.: 18/345,558

(22) Filed: Jun. 30, 2023

(65) Prior Publication Data
US 2023/0354593 A1 Nov. 2, 2023

Related U.S. Application Data

(63) Continuation of application No. PCT/JP2021/047662, filed on Dec. 22, 2021.

(30) Foreign Application Priority Data

Jan. 6, 2021 (JP) .................. 2021-000919

(51) Int. Cl.
*H10B 20/25* (2023.01)
*H01L 23/528* (2006.01)
*H01L 23/66* (2006.01)

(52) U.S. Cl.
CPC .......... *H10B 20/25* (2023.02); *H01L 23/528* (2013.01); *H01L 23/66* (2013.01); *H01L 2223/6605* (2013.01)

(58) Field of Classification Search
CPC ....... H10B 20/25; H01L 23/528; H01L 23/66; H01L 2223/6605; H10D 84/00; H10D 84/038; H10D 89/10
(Continued)

(56) References Cited

U.S. PATENT DOCUMENTS 8,169,049 B2 * 5/2012 Kirisawa ............. H01L 25/0657
257/723
2007/0280012 A1 12/2007 Obayashi et al.
(Continued)

FOREIGN PATENT DOCUMENTS

JP 2006-073947 A 3/2006
JP 2008-211199 A 9/2008
(Continued)

OTHER PUBLICATIONS

International Search Report for PCT/JP2021/047662 dated Mar. 15, 2022.

*Primary Examiner* — Mounir S Amer
*Assistant Examiner* — Nicholas B Michaud
(74) *Attorney, Agent, or Firm* — McDonald Hopkins LLC

(57) ABSTRACT

A semiconductor substrate includes a fuse memory that is a write-once memory, a control unit that writes and reads data to and from the fuse memory, and a digital. A wiring layer includes a wiring conductor that connects the digital and an external connection terminal and a plane conductor provided in between the wiring conductor and a surface of the semiconductor substrate. The wiring conductor overlaps the fuse memory when the wiring conductor and the fuse memory are seen in a stacking direction in which the semiconductor substrate and the wiring layer are stacked on top of each other. The plane conductor is arranged in between the wiring conductor and the fuse memory and is connected to a ground potential.

15 Claims, 4 Drawing Sheets

(58) Field of Classification Search
USPC .................................... 257/499, 528, 529
See application file for complete search history.

(56) References Cited

U.S. PATENT DOCUMENTS

| | | |
|---|---|---|
| 2008/0224140 A1 | 9/2008 | Tokunaga et al. |
| 2014/0151842 A1* | 6/2014 | Kim ..................... H01L 23/564 |
| | | 257/503 |
| 2015/0071394 A1* | 3/2015 | Miyanaga .............. H03B 5/366 |
| | | 375/362 |
| 2016/0268196 A1* | 9/2016 | Imura ................. H01L 23/5258 |
| 2019/0304893 A1* | 10/2019 | Dorgan ............. H01L 21/76838 |
| 2021/0035800 A1 | 2/2021 | Liu |
| 2021/0104460 A1* | 4/2021 | Allman ................. H01L 23/562 |

FOREIGN PATENT DOCUMENTS

| | | |
|---|---|---|
| JP | 2012-033972 A | 2/2012 |
| JP | 4884077 B2 | 2/2012 |
| JP | 2012-146893 A | 8/2012 |
| JP | 2014-165516 A | 9/2014 |
| JP | 2016-171304 A | 9/2016 |

* cited by examiner

ELECTRONIC CIRCUIT DEVICE

CROSS REFERENCE TO RELATED APPLICATION

This is a continuation of International Application No. PCT/JP2021/047662 filed on Dec. 22, 2021 which claims priority from Japanese Patent Application No. 2021-000919 filed on Jan. 6, 2021. The contents of these applications are incorporated herein by reference in their entireties.

BACKGROUND ART

Technical Field

The present disclosure relates to an electronic circuit device including a circuit that includes a write-once memory such as an electronic fuse or the like.

The patent document 1 describes a wireless communication device. The wireless communication device of the patent document 1 includes a RFIC. The RFIC includes a fuse and a RF signal processing unit.

The fuse is a write-once memory. The RFIC controls the RF signal processing unit by using information written in the fuse.

Patent Document 1: Japanese Unexamined Patent Application Publication No. 2014-165516

BRIEF SUMMARY

However, in the RFIC such as the one illustrated in the related art, there is a problem of incorrect information being written in the fuse.

The present disclosure provides an electronic circuit device that can suppress writing of incorrect information into a fuse.

An electronic circuit device of this disclosure includes a semiconductor substrate, a wiring layer provided on a surface of the semiconductor substrate, and an external connection terminal provided on an outside surface of the wiring layer on an opposite side from the semiconductor substrate. The semiconductor substrate includes a memory that is a write-once memory, a control unit that writes and reads data to and from the memory, and a communication control unit that controls data communication between the control unit and an outside. The wiring layer includes a first wiring conductor that connects the communication control unit and the external connection terminal, and a plane conductor provided in between the first wiring conductor and the surface of the semiconductor substrate. The first wiring conductor overlaps the memory when the first wiring conductor and the memory are seen in a stacking direction in which the semiconductor substrate and the wiring layer are stacked on top of one another. The plane conductor is arranged in between the first wiring conductor and the memory and is connected to a fixed potential.

In this configuration, even in the case where unwanted noise is emitted from the external connection terminal and the first wiring conductor, such noise can be blocked by the plane conductor. According to this, propagation of unwanted noise to the memory is suppressed. Further, erroneous writing to the memory is suppressed.

According to this disclosure, it becomes possible to suppress writing of incorrect information into the fuse.

DETAILED DESCRIPTION

First Embodiment

An electronic circuit device according to a first embodiment of the present disclosure is described with reference to the drawings.

(Circuit Configuration of Electronic Circuit Device 10)

Figure 1:
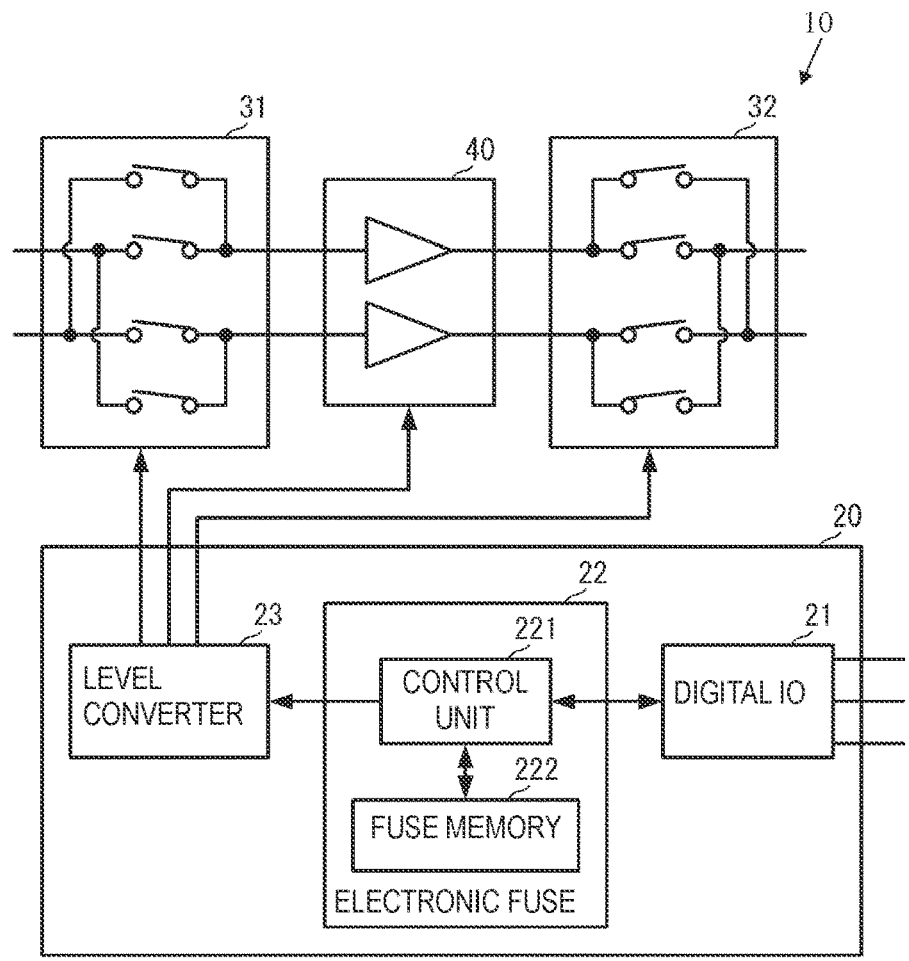
FIG. 1 is an equivalent circuit diagram illustrating one example of configuration of an electronic circuit device 10 according to an embodiment of the present disclosure.

FIG. 1 is an equivalent circuit diagram illustrating one example of configuration of an electronic circuit device 10 according to an embodiment of the present disclosure.

The electronic circuit device 10 is, for example, a RFIC. The electronic circuit device 10 includes an IC control unit 20, a switch circuit 31, a switch circuit 32, and an amplifier circuit 40. The part made up of the switch circuit 31, the switch circuit 32, and the amplifier circuit 40 corresponds to a "RF signal processing unit" of the present disclosure.

The switch circuit 31 is connected to the input side of the amplifier circuit 40. The switch circuit 32 is connected to the output side of the amplifier circuit 40. The amplifier circuit 40 includes a plurality of LNAs (low noise amplifiers). The switch circuit 31 and the switch circuit 32 performs control in such a manner as to select a plurality of LNAs.

The switch circuit 31 and the switch circuit 32 perform the foregoing control of selecting the plurality of LNAs based on control signals from the IC control unit 20. Further, the amplifier circuit 40 performs control of operations of the plurality of LNAs based on a control signal from the IC control unit 20.

The IC control unit 20 includes a digital IO 21, an electronic fuse 22, and a level converter 23. The digital IO 21 is connected to the electronic fuse 22. The electronic fuse 22 is connected to the level converter 23. The level converter 23 is connected to the switch circuit 31, the switch circuit 32, and the amplifier circuit 40. The digital IO 21 corresponds to a "communication control unit" of the present disclosure.

The digital IO 21 is an interface unit that interfaces between the IC control unit 20 and a circuit or a device outside the electronic circuit device 10. The digital IO 21 controls outputting and inputting of a digital signal to and from an external circuit or an external device. For example, the digital IO 21 receives input of serial data (Serial Data), serial clock (Serial Clock), and ID select data (ID Select Data) from outside.

More specifically, the digital IO 21 receives input of the serial data via an external connection terminal for serial data, provided in the electronic circuit device 10. The digital IO 21 receives input of the serial clock via an external connection terminal for serial clock, provided in the electronic circuit device 10. The digital IO 21 receives input of the ID select data via an external connection terminal for ID select data, provided in the electronic circuit device 10.

The digital IO 21 outputs the received serial data, serial clock, and ID select data to the electronic fuse 22.

The electronic fuse 22 includes a control unit 221 and a fuse memory 222. The serial data, the serial clock, and the ID select data are input to the control unit 221.

The fuse memory 222 is a write-once memory (OTP memory: One Time Programmable Memory). Specifically, the fuse memory 222 is a memory into which data can be written only once based on a predetermined write condition. Once the data have been written, the fuse memory 222 can retain data without necessarily power.

The control unit 221 performs various kinds of controls by using, for example, the serial clock.

In the case where serial data is data to be written into the fuse memory 222, the control unit 221 writes the serial data input from the digital IO 21 into the fuse memory 222.

Further, the control unit 221 generates control signals to be output to the switch circuit 31, the switch circuit 32, and the amplifier circuit 40 by using the ID select data and the data written into the fuse memory 222, and outputs generated control signals to the level converter 23. For example, the control unit 221 generates the control signals by using a control condition of the amplifier circuit 40 (for example, the value of the ID select data) that is input via the digital IO 21 or the like and the data to be written into the fuse memory 222, and outputs the generated control signals to the level converter 23.

The level converter 23 converts respective levels of the control signals for the switch circuit 31, the switch circuit 32, and the amplifier circuit 40. The level converter 23 outputs the control signals, whose levels have been changed, to the switch circuit 31, the switch circuit 32, and the amplifier circuit 40. Note that in the case where the control unit 221 is capable of outputting control signals that can be processed at the switch circuit 31, the switch circuit 32, and the amplifier circuit 40, the level converter 23 can be omitted.

As described above, based on the data written into the fuse memory 222, the electronic circuit device 10 properly controls the switch circuit 31, the switch circuit 32, and the amplifier circuit 40. Therefore, when the data written into the fuse memory 222 are incorrect or corrupted, the electronic circuit device 10 cannot properly control the switch circuit 31, the switch circuit 32, and the amplifier circuit 40.

(Structure of Electronic Circuit Device 10)

Figure 2:
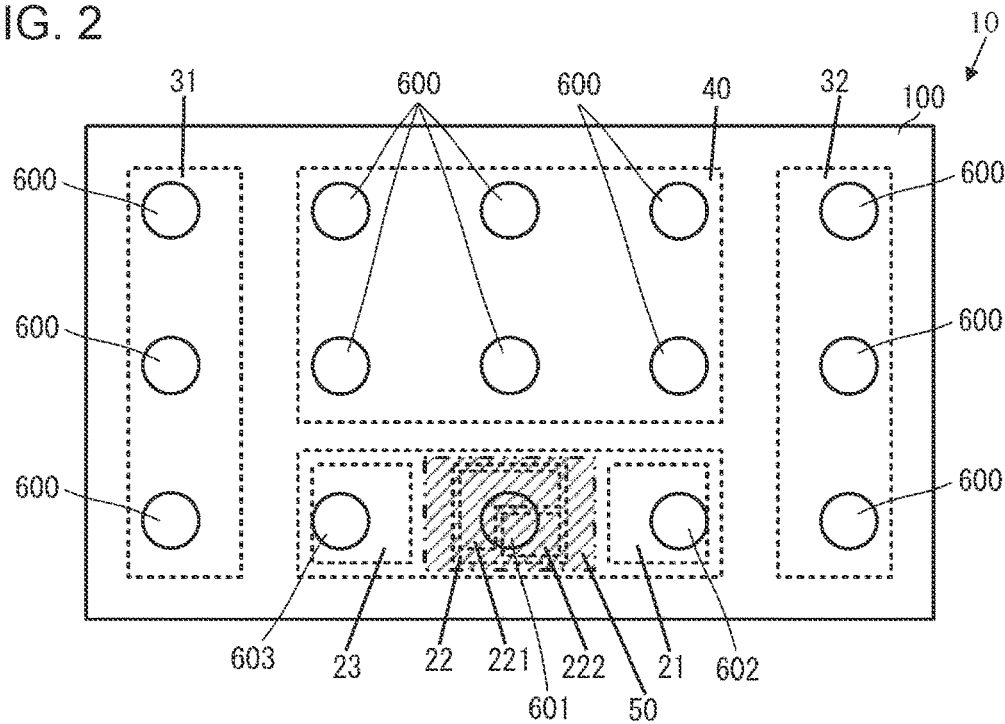
FIG. 2 is a plan view of the electronic circuit device 10 according to a first embodiment.
Figure 3:
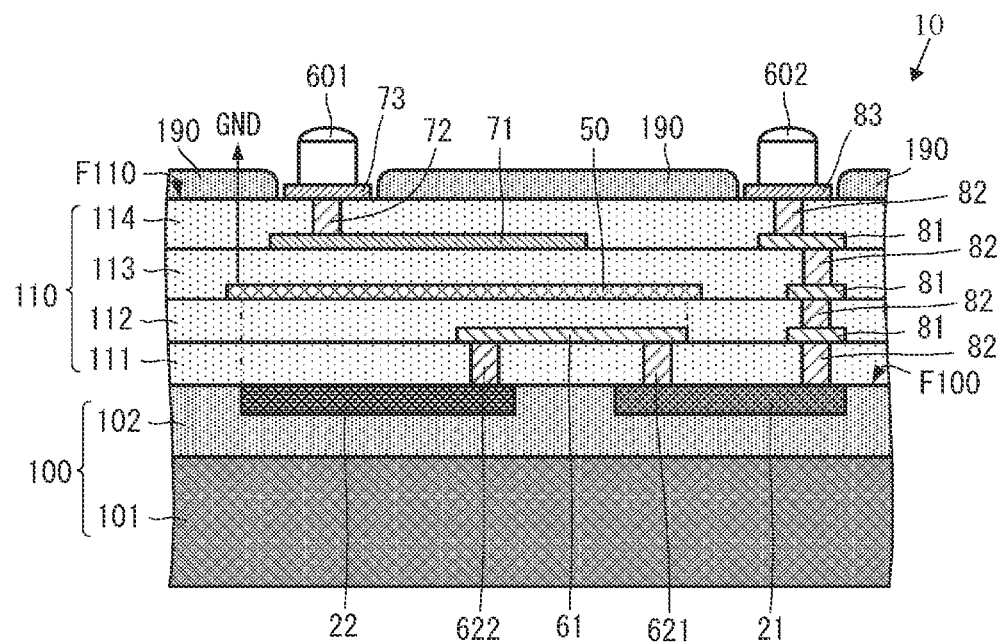
FIG. 3 is a partially enlarged sectional view of the electronic circuit device 10 according to the first embodiment.

In order to resolve the foregoing problem, the electronic circuit device 10 includes the following configuration. FIG. 2 is a plan view of the electronic circuit device 10 according to the first embodiment. FIG. 3 is a partially enlarged sectional view of the electronic circuit device 10 according to the first embodiment. Note that in FIG. 2 and FIG. 3, for ease of understanding of the configuration, shapes of respective parts are emphasized if appropriate. Similarly, in the drawings of the following embodiments, shapes of respective parts are also emphasized if appropriate.

As illustrated in FIG. 2 and FIG. 3, the electronic circuit device 10 includes a semiconductor substrate 100, a wiring layer 110, and a plurality of external connection terminals 600, 601, 602, and 603. The semiconductor substrate 100 is, for example, a silicon substrate.

The semiconductor substrate 100 is made up of a support part 101 and an embedded oxide layer 102 in the vicinity of a surface F100. In the embedded oxide layer 102, the IC control unit 20, the switch circuit 31, the switch circuit 32, and the amplifier circuit 40 are formed. As illustrated in FIG. 2, the IC control unit 20 (the digital IO 21, the electronic fuse 22, and the level converter 23), the switch circuit 31, the switch circuit 32, and the amplifier circuit 40 are formed in such a manner as not to overlap each other (at different locations) in plan view of the semiconductor substrate 100. For example, the switch circuit 31, the amplifier circuit 40 and the IC control unit 20, and the switch circuit 32 are formed in this order in a first direction in plan view. Further, the amplifier circuit 40 and the IC control unit 20 are arranged in this order in a second direction in plan view. According to this, while arranging the IC control unit 20, the switch circuit 31, the switch circuit 32, and the amplifier circuit 40 at different locations, connecting lines (for example, conductor patterns for connecting lines) between the IC control unit 20, the switch circuit 31, the switch circuit 32, and the amplifier circuit 40 can be made simple and short.

The wiring layer 110 is formed on the surface F100 of the semiconductor substrate 100. In other words, the wiring layer 110 is formed on a surface of the embedded oxide layer 102 on the opposite side from the support part 101. The wiring layer 110 has a multilayer structure including a plurality of insulator layers 111 to 114. The insulator layer 111 is formed on the surface F100 of the semiconductor substrate 100. The insulator layer 112 is formed on a surface of the insulator layer 111 on the opposite side from the surface at which the insulator layer 111 abuts onto the semiconductor substrate 100. The insulator layer 113 is formed on a surface of the insulator layer 112 on the opposite side from the surface at which the insulator layer 112 abuts onto the insulator layer 111. The insulator layer 114 is formed on a surface of the insulator layer 113 on the opposite side from the surface at which the insulator layer 113 abuts onto the insulator layer 112. A surface of the insulator layer 114 on the opposite side from the insulator layer 113 side is an outside surface F110 of the wiring layer 110. In other words, the insulator layer 111, the insulator layer 112, the insulator layer 113, and the insulator layer 114 are sequentially formed in this order in a direction from the surface F100 of the semiconductor substrate 100 to the outside surface F110 of the wiring layer 110.

In the wiring layer 110, various kinds of conductors are formed. Details of shapes and layout of the various kinds of conductors will be described below.

On the outside surface F110 of the wiring layer 110, a plurality of the external connection terminals 600, the external connection terminal 601, the external connection terminal 602, and the external connection terminal 603 are formed. The plurality of the external connection terminals 600 and the external connection terminal 603 are formed on pad conductors for external connection, which are not illustrated in the drawings. The external connection terminal 601 is formed on a pad conductor 73 for external connection. The external connection terminal 602 is formed on a pad conductor 73 for external connection. The plurality of the external connection terminals 600, the external connection terminal 601, the external connection terminal 602, and the external connection terminal 603 are realized using copper pillar bumps, solder bumps, or the like. The external connection terminal 601 corresponds to an "external connection terminal" in Claims of the present disclosure.

Note that instead of the plurality of the external connection terminals 600, the external connection terminal 601, the external connection terminal 602, and the external connection terminal 603, pad conductors for external connection on which the plurality of the external connection terminals 600 are formed, the pad conductor 73 for external connection, and the pad conductor 73 for external connection may alternatively be used as external connection terminals (for example, pads for wire bonding).

An insulating resist film 190 is formed on the outside surface F110 of the wiring layer 110 in a part other than the area where the foregoing pad conductors for external connection are formed.

As illustrated in FIG. 2, the plurality of the external connection terminals 600, the external connection terminal 601, the external connection terminal 602, and the external connection terminal 603 are arranged on the outside surface F110 of the wiring layer 110 in a predetermined pattern in plan view (seen in a stacking direction in which the semiconductor substrate 100 and the wiring layer 110 are stacked on top of each other).

In this case, the external connection terminal 601, the external connection terminal 602, and the external connection terminal 603 are arranged at the locations that overlap the IC control unit 20 in plan view. Specifically, for example, as illustrated in FIG. 2 and FIG. 3, the external connection terminal 601 is arranged at a location that overlaps the electronic fuse 22 of the IC control unit 20. The external connection terminal 602 is arranged at a location that overlaps the digital IO 21 of the IC control unit 20. Further, the external connection terminal 603 is arranged at a location that overlaps the level converter 23. For example, the external connection terminal 601 is an external connection terminal for serial data, the external connection terminal 602 is an external connection terminal for serial clock, and the external connection terminal 603 is an external connection terminal for ID select data. Note that in the present specification, the case where "A overlaps B" is defined to include not only the case where A overlaps the entire part of B but also the case where A overlaps only part of B.

According to this, it becomes possible to shorten distances from the IC control unit 20 to the external connection terminal 601, the external connection terminal 602, and the external connection terminal 603 while maintaining distances between the external connection terminals at predetermined distances. Further, it becomes possible to suppress unwanted electromagnetic interferences between the external connection terminals and the circuits. Here, the external connection terminals are the external connection terminal 601, the external connection terminal 602, and the external connection terminal 603, through which digital signals, such as serial data, serial clock, and the like travel, and the circuits are the switch circuit 31, the switch circuit 32, and the amplifier circuit 40, through which radio frequency signals travel. Specifically, it becomes possible to suppress mixing of unwanted waves, which is caused by harmonic waves originated from the digital signals, with signals traveling through the switch circuit 31, the switch circuit 32, and the amplifier circuit 40, and occurrence of intermodulation between such unwanted waves and these signals.

(Conductor Pattern of Wiring Layer 110)

As illustrated in FIG. 3, a wiring conductor 61 is formed at the interface (contact plane) between the insulator layer 111 and the insulator layer 112. The wiring conductor 61 is, for example, a linear conductor pattern having a predetermined width. When seen in the stacking direction of the semiconductor substrate 100 and the wiring layer 110, one end portion of the wiring conductor 61 in an extending direction thereof overlaps the digital IO 21, and the other end portion of the wiring conductor 61 in the extending direction overlaps the electronic fuse 22. It is suitable that the wiring conductor 61 has a shortest possible length. The one end portion of the wiring conductor 61 is connected to the digital IO 21 with an interlayer connection conductor 621, which is formed in the insulator layer 111, interposed therebetween. The other end portion of the wiring conductor 61 is connected to the electronic fuse 22 with an interlayer connection conductor 622, which is formed in the insulator layer 111, interposed therebetween. The wiring conductor 61 corresponds to a "second wiring conductor" of the present disclosure.

A wiring conductor 71 is formed at the interface between the insulator layer 113 and the insulator layer 114. The wiring conductor 71 is, for example, a linear conductor pattern having a predetermined width. In plan view of the semiconductor substrate 100, the wiring conductor 71 overlaps the electronic fuse 22.

One end portion of the wiring conductor 71 in an extending direction thereof is connected to the pad conductor 73 for external connection with an interlayer connection conductor 72, which is formed in the insulator layer 114, interposed therebetween. That is to say, the one end portion of the wiring conductor 71 in the extending direction thereof is connected to the external connection terminal 601. The other end portion of the wiring conductor 71 in the extending direction thereof is connected to the digital IO 21 with an interlayer connection conductor or the like, which is not illustrated in the drawing, interposed therebetween. The wiring conductor 71 corresponds to a "first wiring conductor" of the present disclosure.

In this case, it is suitable that a conductor pattern that connects the other end portion of the wiring conductor 71 in the extending direction thereof and the digital IO 21 does not overlap the switch circuit 31, the switch circuit 32, and the amplifier circuit 40. According to this, it becomes possible to suppress unwanted electromagnetic interferences between the conductor pattern, which connects the other end portion of the wiring conductor 71 in the extending direction thereof and the digital IO 21, and the switch circuit 31, the switch circuit 32, and the amplifier circuit 40.

A plane conductor 50 is formed at the interface between the insulator layer 112 and the insulator layer 113. The plane conductor 50 is connected to an external connection terminal for ground via an interlayer connection conductor or the like, which is not illustrated in the drawing. That is to say, the plane conductor 50 is connected to a ground potential.

As illustrated in FIG. 2, the plane conductor 50 is, for example, a rectangle in plan view. That is to say, the plane conductor 50 is a conductor that has a predetermined thickness and widely extends, compared with the wiring conductor, in a two-dimensional plane, which is orthogonal to a thickness direction. As illustrated in FIG. 3, the plane conductor 50 is arranged in between the wiring conductor 71 and the electronic fuse 22. In other words, the plane conductor 50 is arranged at a location that overlaps the wiring conductor 71 and the electronic fuse 22 in plan view.

With the configuration described above, the foregoing serial data is supplied from the external connection terminal 601. A radio frequency signal for the serial data is input to the digital IO 21 from the external connection terminal 601 via the interlayer connection conductor 72 and the wiring conductor 71.

In this case, a radio frequency signal for the serial data or noise input to the external connection terminal 601 leaks from the wiring conductor 71 into the wiring layer 110. However, the radio frequency signal and the noise leaked from the wiring conductor 71 to the insulator layer 113 side are blocked by the plane conductor 50. Therefore, propagations of the radio frequency signal and the noise to the electronic fuse 22 are suppressed. According to this, writing of incorrect information to the electronic fuse 22 and/or corruption of data written to the electronic fuse 22 caused by the radio frequency signal or the noise is suppressed.

Particularly, in some cases, a digital signal having a large amplitude is used to improve decoding accuracy or the like. In this case, a radio frequency signal for the digital signal also has a large amplitude. However, by having the foregoing configuration, even when such a radio frequency signal for a digital signal with a large amplitude is used, the electronic circuit device 10 further ensures the suppression of writing of incorrect information to the electronic fuse 22 and/or corruption of data written to the electronic fuse 22.

Moreover, the plane conductor 50 is arranged in such a manner as to extend in between the wiring conductor 71 and the wiring conductor 61. In other words, the plane conductor 50 is arranged at a location that overlaps the wiring conductor 71 and the wiring conductor 61 in plan view. Accordingly, propagations of the radio frequency signal and the noise from the wiring conductor 71 to the wiring conductor 61 are suppressed. According to this, propagations of the radio frequency signal and the noise to the electronic fuse 22 via the wiring conductor 61 are suppressed. As a result, writing of incorrect information to the electronic fuse 22 and/or corruption of data written to the electronic fuse 22 caused by the radio frequency signal or the noise is suppressed. Note that in plan view, the plane conductor 50 does not necessarily overlap the electronic fuse 22 and may overlap only the wiring conductor 71 and the wiring conductor 61. This case also facilitates the suppression of leaking of the radio frequency signal and the noise from the wiring conductor 71.

Further, in this configuration, as described above, the external connection terminal 601 and the electronic fuse 22 can be arranged in such a manner as to overlap each other in plan view. Accordingly, the plane area of the electronic circuit device 10 can be reduced, and the electronic circuit device 10 can be reduced in size. In other words, even in the case where the electronic circuit device 10 is reduced in size, it becomes possible to suppress the writing of incorrect information to the electronic fuse 22 and/or the corruption of data written to the electronic fuse 22 caused by the radio frequency signal or the noise, which is leaked into the wiring layer 110.

Particularly, the electronic circuit device 10 includes the amplifier circuit 40 including LNAs, the switch circuit 31, and the switch circuit 32. Here, the switch circuit 31 and the switch circuit 32 are connected to the amplifier circuit 40. As an RF module, in these circuits, power (level) of a radio frequency signal to be processed is small. In this case, if the amplifier circuit 40, the switch circuit 31, and the switch circuit 32 are overlapped with the IC control unit 20, wiring conductors relating to the IC control unit 20, and external connection terminals relating to the IC control unit 20, the amplifier circuit 40, the switch circuit 31, and the switch circuit 32 are likely to be affected by the serial data, the serial clock, and the ID select data, which are described above. Therefore, characteristics of the LNAs such as NF (Noise Figure) and the like degrade.

Further, if the distance between the IC control unit 20 and the circuits, which are the amplifier circuit 40, the switch circuit 31, and the switch circuit 32, is increased, the electronic circuit device 10 increases in size, and noise is likely to be superimposed on the control signals from the IC control unit 20. That is to say, a malfunction is likely to occur. Accordingly, it is suitable that the amplifier circuit 40, the switch circuit 31, and the switch circuit 32 are located close to the IC control unit 20.

In this case, influence of the serial data, the serial clock, and the ID select data can be suppressed by separating the external connection terminals 601, 602, and 603, which are connected to the IC control unit 20, from the IC control unit 20, the switch circuit 31, the switch circuit 32, and the amplifier circuit 40. However, this increases the size of electronic circuit device 10.

Because of this, as in the disclosure of the present application, by arranging the external connection terminals 601, 602, and 603, to which the serial data, the serial clock, and the ID select data are input, in such a manner as to overlap the IC control unit 20, the electronic circuit device 10 can be reduced in size. Moreover, influence of the serial data, the serial clock, and the ID select data on the switch circuit 31, the switch circuit 32, and the amplifier circuit 40 can be suppressed.

However, as described above, if the plane conductor 50 such as the one in the disclosure of the present application is not used, there is a possibility of erroneous writing to the electronic fuse 22 and/or corruption of data written to the electronic fuse 22 as described above. In view of this, the electronic circuit device 10 of the disclosure of the present application includes the plane conductor 50, as described above. Because of this, it becomes possible to reduce the size of the electronic circuit device 10 and suppress degradation of characteristics of a radio frequency signal processing unit, which includes LNAs. Further, the erroneous writing to the electronic fuse 22 and/or the corruption of data written to the electronic fuse 22 can be suppressed effectively.

Note that the foregoing description illustrates the mode in which the plane conductor 50 is connected to the ground potential. However, the plane conductor 50 may be connected to another fixed potential such as, for example, a potential of DC power supplied to the electronic circuit device 10. However, by connecting the plane conductor 50 to the ground potential, the electronic circuit device 10 can suppress the erroneous writing to the electronic fuse 22 and/or the corruption of data written to the electronic fuse 22 more stably.

Further, in the foregoing configuration, the external connection terminal 602 and the digital IO 21 overlap each other in plan view. Further, the external connection terminal 602 and the digital IO 21 are connected in a substantially stacking direction using conductors 81 for connection and interlayer connection conductors 82 formed in the respective insulator layers of the wiring layer 110. According to this, the electronic circuit device 10 can suppress erroneous writing to the electronic fuse 22 and/or corruption of data written to the electronic fuse 22 caused by the serial clock or noise input from the external connection terminal 602.

Note that although it is not illustrated in the drawings, the external connection terminal 603 and a wiring conductor connected to the external connection terminal 603 are similarly arranged, for example, at locations that overlap the plane conductor 50. According to this, the electronic circuit device 10 can suppress erroneous writing to the electronic fuse 22 and/or corruption of data written to the electronic fuse 22 caused by the ID select data or noise input from the external connection terminal 603.

Further, the wiring conductor 71 is provided at a location that is in between the surface F100 of the semiconductor substrate 100 and the outside surface F110 of the wiring layer 110 and that is closer to the outside surface F110. According to this, the distance between a group of the external connection terminal 601 and the wiring conductor 71 and a group of the electronic fuse 22 and the wiring conductor 61 becomes greater. Accordingly, the electronic circuit device 10 can further suppress the influence of a radio frequency signal of digital data and noise on the electronic fuse 22. That is to say, the electronic circuit device 10 can ensure the suppression of the erroneous writing to the electronic fuse 22 and/or the corruption of data written to the electronic fuse 22.

Further, in the foregoing configuration, the wiring layer 110 is made up of a wiring layer for functional unit formation and a redistribution layer. The wiring layer for functional unit formation is made up of the insulator layer 111 and the insulator layer 112. The redistribution layer is made up of the insulator layer 113 and the insulator layer 114 and connects the functional unit to a plurality of the external connection terminals. Further, the insulator layer 113 and the insulator layer 114 are thicker than the insulator layer 111 and the insulator layer 112. According to this, the distance between the group of the external connection terminal 601 and the wiring conductor 71 and the group of the electronic fuse 22 and the wiring conductor 61 becomes greater. Accordingly, the electronic circuit device 10 can further suppress the influence of a radio frequency signal of digital data and noise on the electronic fuse 22 and can ensure the suppression of the erroneous writing to the electronic fuse 22 and/or the corruption of data written to the electronic fuse 22. Note that the wiring layer for functional unit formation corresponds to a "first wiring layer" of the present disclosure, and the redistribution layer corresponds to a "second wiring layer" of the present disclosure. Accordingly, in this case, the insulator layer 111 and the insulator layer 112 correspond to a "first insulator layer" of the present disclosure, and the insulator layer 113 and the insulator layer 114 correspond to a "second insulator layer" of the present disclosure.

Further, in the foregoing description, the semiconductor substrate 100 is a silicon substrate. Alternatively, the semiconductor substrate 100 may be made of a different material. However, the use of a silicon substrate facilitates formations of the IC control unit 20, the switch circuit 31, the switch circuit 32, and the amplifier circuit 40.

Second Embodiment

Figure 4:
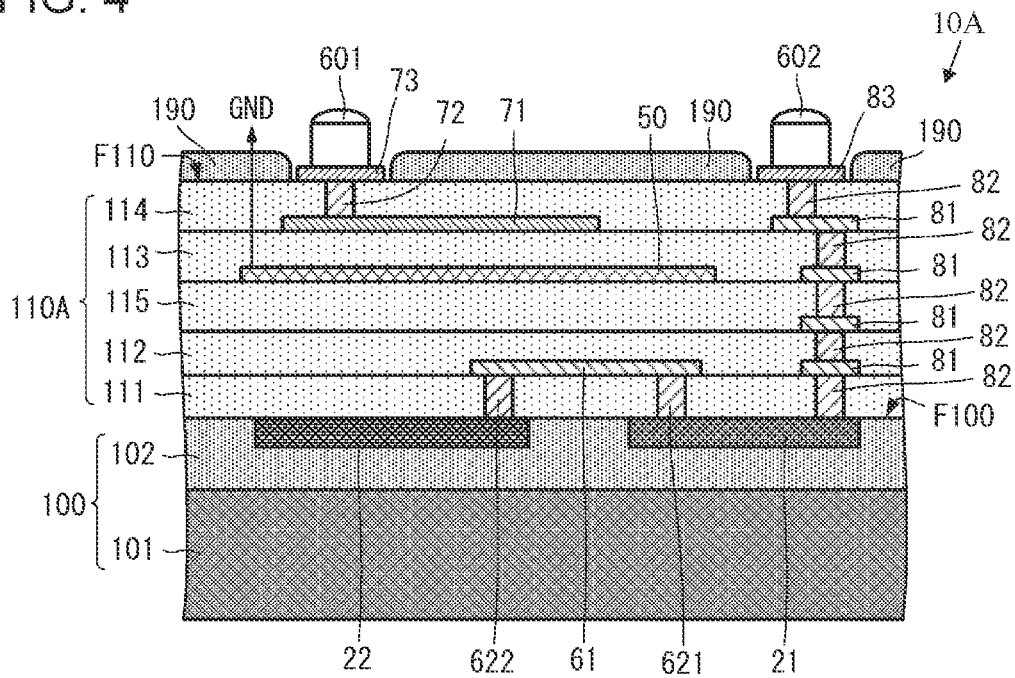
FIG. 4 is a partially enlarged sectional view of an electronic circuit device 10A according to a second embodiment.

An electronic circuit device according to a second embodiment of the present disclosure is described with reference to the drawings. FIG. 4 is a partially enlarged sectional view of an electronic circuit device 10A according to the second embodiment.

As illustrated in FIG. 4, the electronic circuit device 10A according to the second embodiment is different from the electronic circuit device 10 according to the first embodiment in the configuration of a wiring layer 110A. The remaining configuration of the electronic circuit device 10A is similar to that of the electronic circuit device 10, and the description regarding the similar part is omitted.

The electronic circuit device 10A includes the wiring layer 110A. The wiring layer 110A is different from the wiring layer 110 in that an insulator layer 115 is added to the wiring layer 110. The remaining configuration of the wiring layer 110A is similar to that of the wiring layer 110, and the description regarding the similar part is omitted.

The insulator layer 115 is arranged in between the insulator layer 112 and the insulator layer 113. According to this, the redistribution layer has a multilayer structure of the insulator layer 115, the insulator layer 113, and the insulator layer 114.

According to the configuration described above, the plane conductor 50 is arranged at an intermediate location of the redistribution layer in the stacking direction. According to this, the distance between the electronic fuse 22 and the plane conductor 50 and the distance between the wiring conductor 61 and the plane conductor 50 become greater. Accordingly, the electronic circuit device 10A can further suppress the influence of a radio frequency signal of digital data and noise on the electronic fuse 22. That is to say, the electronic circuit device 10A can ensure the suppression of the erroneous writing to the electronic fuse 22 and/or the corruption of data written to the electronic fuse 22.

Third Embodiment

Figure 5:
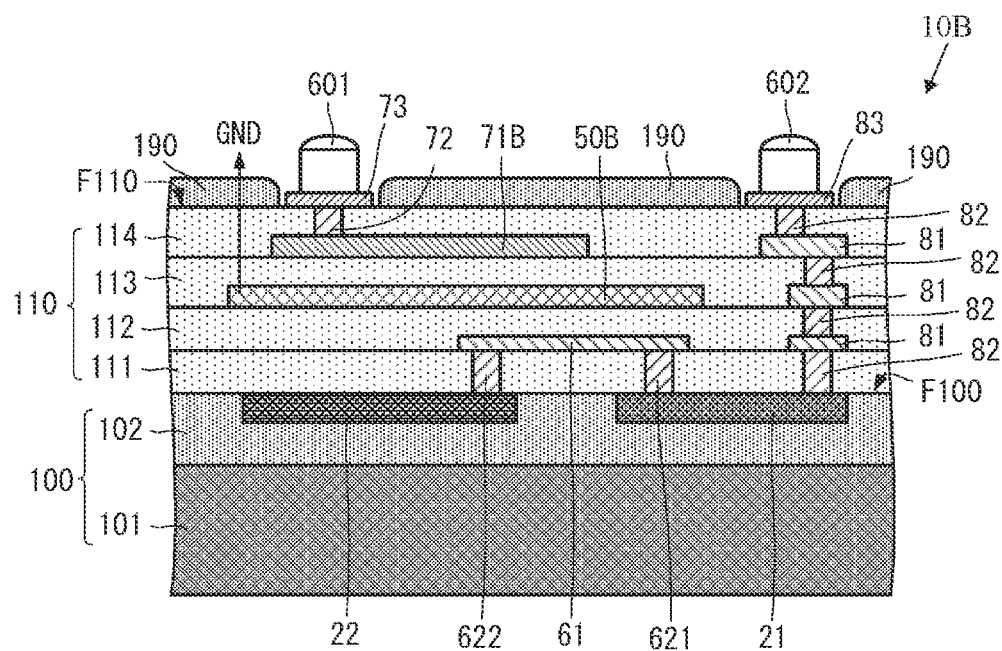
FIG. 5 is a partially enlarged sectional view of an electronic circuit device 10B according to a third embodiment.

An electronic circuit device according to a third embodiment of the present disclosure is described with reference to the drawings. FIG. 5 is a partially enlarged sectional view of an electronic circuit device 10B according to the third embodiment.

As illustrated in FIG. 5, the electronic circuit device 10B according to the third embodiment is different from the electronic circuit device 10 according to the first embodiment in the configuration of a plane conductor 50B. The remaining configuration of the electronic circuit device 10B is similar to that of the electronic circuit device 10, and the description regarding the similar part is omitted.

The electronic circuit device 10B includes the plane conductor 50B. The plane conductor 50B is thicker than the wiring conductor 61. According to this, the plane conductor 50B ensures blocking of a radio frequency signal of digital data and noise from a wiring conductor 71B. Accordingly, the electronic circuit device 10B can further suppress the influence of the radio frequency signal of digital data and the noise on the electronic fuse 22. That is to say, the electronic circuit device 10B can ensure the suppression of erroneous writing to the electronic fuse 22 and/or corruption of data written to the electronic fuse 22.

Note that by forming the plane conductor 50B in the redistribution layer, the thickness of the plane conductor 50B can be easily increased. For example, by using different formation methods to form the wiring layer for functional unit formation and the redistribution layer, it becomes possible to reduce the overall thickness of the wiring layer for functional unit formation, in which a higher integration is desirable, and increase the overall thickness of the redistribution layer, in which a lower transmission loss is desirable. Further, by forming the plane conductor 50B in this redistribution layer, the thickness of the plane conductor 50B can be easily increased.

Fourth Embodiment

Figure 6:
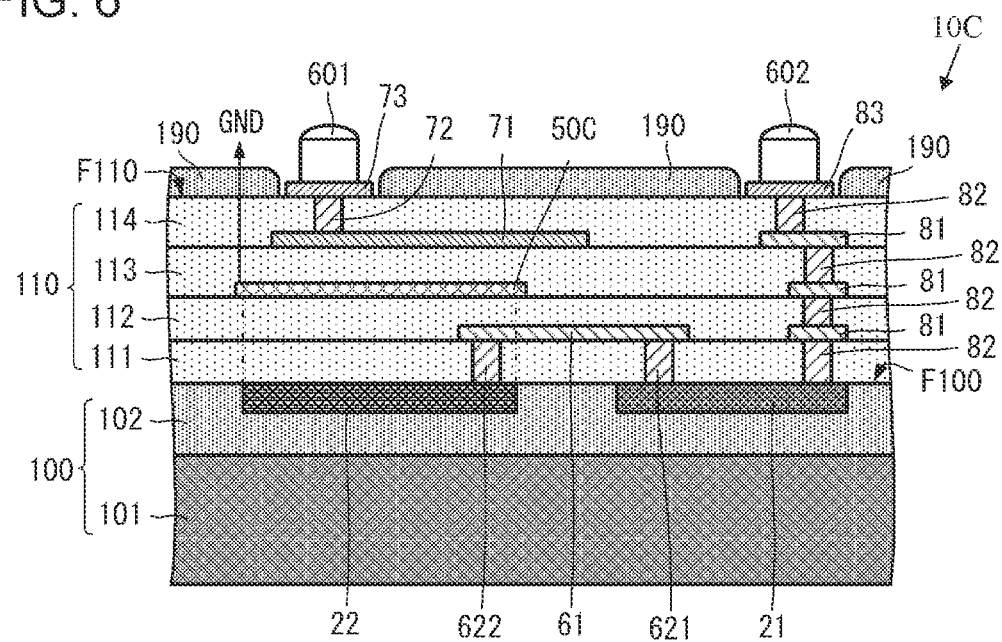
FIG. 6 is a partially enlarged sectional view of an electronic circuit device 10C according to a fourth embodiment.

An electronic circuit device according to a fourth embodiment of the present disclosure is described with reference to the drawings. FIG. 6 is a partially enlarged sectional view of the electronic circuit device 10C according to the fourth embodiment.

As illustrated in FIG. 6, the electronic circuit device 10C according to the fourth embodiment is different from the electronic circuit device 10 according to the first embodiment in that the electronic circuit device 10C has a plane conductor 50C. The remaining configuration of the electronic circuit device 10C is similar to that of the electronic circuit device 10, and the description regarding the similar part is omitted.

The electronic circuit device 10C includes the plane conductor 50C. In plan view, the plane conductor 50C overlaps the electronic fuse 22 but does not overlap part of the wiring conductor 61.

Even with the configuration described above, the electronic fuse 22 and the plane conductor 50C overlap each other. Thus, the electronic circuit device 10C can further suppress the influence of a radio frequency signal of digital data and noise on the electronic fuse 22. That is to say, the electronic circuit device 10C can ensure the suppression of the erroneous writing to the electronic fuse 22 and/or the corruption of data written to the electronic fuse 22.

Note that as long as the plane conductor 50C overlaps the fuse memory 222 of the electronic fuse 22, the foregoing functions and effects can be produced. Further, in this case, it is more suitable that the plane conductor 50C also overlaps a connection conductor for memory (for example, a conductor pattern formed in the embedded oxide layer 102) that connects the fuse memory 222 and the control unit 221.

According to these configurations, the plane conductor 50C can be formed with a smallest possible area. Accordingly, the electronic circuit device 10C can improve flexibility in layout of other conductor patterns to be formed on the same layer as the plane conductor 50C.

Fifth Embodiment

Figure 7:
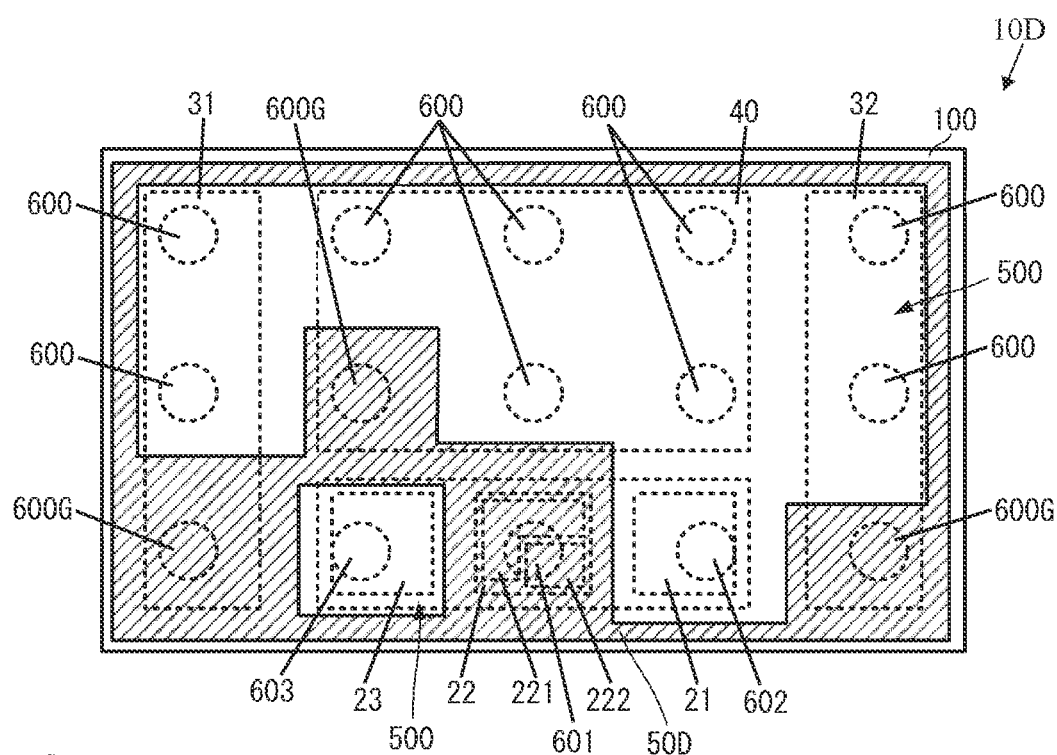
FIG. 7 is a plan view of an electronic circuit device 10D according to a fifth embodiment.

An electronic circuit device according to a fifth embodiment of the present disclosure is described with reference to the drawings. FIG. 7 is a plan view of an electronic circuit device 10D according to the fifth embodiment. Note that in FIG. 7, for ease of understanding of the configuration, a plane conductor is illustrated by solid line, and other constituent elements that overlap the plane conductor are illustrated by dashed line.

As illustrated in FIG. 7, the electronic circuit device 10D according to the fifth embodiment is different from the electronic circuit device 10 according to the first embodiment in that the electronic circuit device 10D has a plane conductor 50D. The remaining configuration of the electronic circuit device 10D is similar to that of the electronic circuit device 10, and the description regarding the similar part is omitted.

The electronic circuit device 10D includes the plane conductor 50D. The plane conductor 50D has a shape extending across substantially the entire areas of the semiconductor substrate and the wiring layer. Further, the plane conductor 50D overlaps the external connection terminal 601 and external connection terminals 600G that are connected to the ground potential and has devoid-of-conductor parts 500 in such a manner as not to overlap other external connection terminals 600.

According to the configuration described above, as is the case with the electronic circuit device 10, the electronic circuit device 10D can further suppress the influence of a radio frequency signal of digital data and noise on the electronic fuse 22. That is to say, the electronic circuit device 10D can ensure the suppression of the erroneous writing to the electronic fuse 22 and/or the corruption of data written to the electronic fuse 22.

Further, in this configuration, the area of the plane conductor 50D to be connected to the ground potential increases. According to this, the electronic circuit device 10D can further ensure the suppression of the erroneous writing to the electronic fuse 22 and/or the corruption of data written to the electronic fuse 22.

Note that the shapes and the locations of the devoid-of-conductor parts 500 illustrated in FIG. 7 are mere examples and can be appropriately set based on the layout of the external connection terminals 600G to be connected to the ground potential, the layout of the other external connection terminals 600, various kinds of wiring patterns within the wiring layer, and the like. To put it the other way around, by appropriately arranging the devoid-of-conductor parts 500, it becomes possible to improve flexibility in layout of various kinds of the wiring patterns within the wiring layer.

Sixth Embodiment

Figure 8:
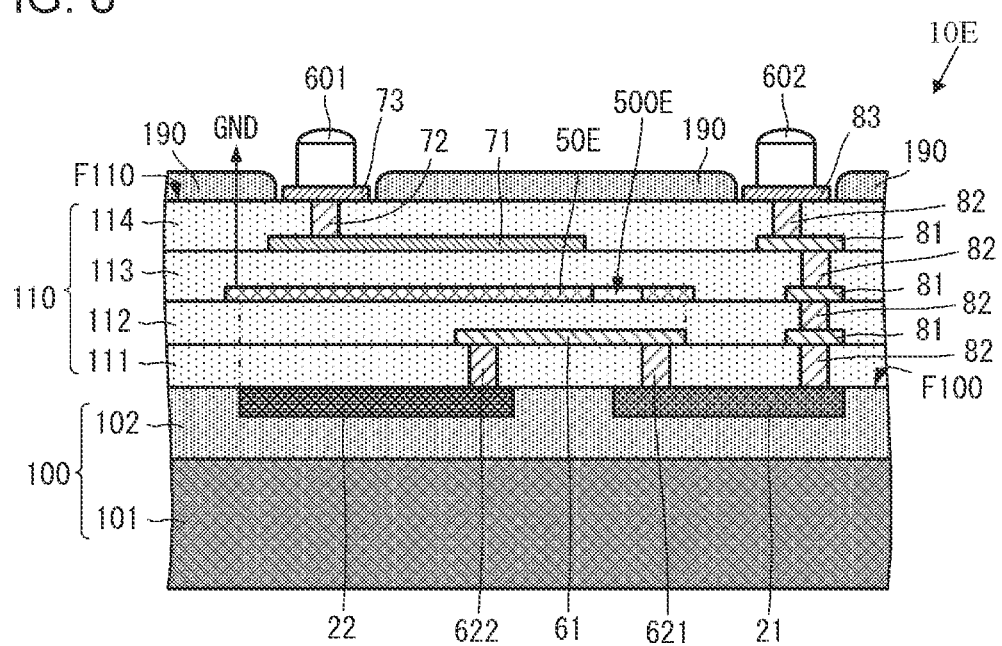
FIG. 8 is a partially enlarged sectional view of an electronic circuit device 10E according to a sixth embodiment.

An electronic circuit device according to a sixth embodiment of the present disclosure is described with reference to the drawings. FIG. 8 is a partially enlarged sectional view of the electronic circuit device 10E according to the sixth embodiment.

As illustrated in FIG. 8, the electronic circuit device 10E according to the sixth embodiment is different from the electronic circuit device 10 according to the first embodiment in that the electronic circuit device 10E has a plane conductor 50E. The remaining configuration of the electronic circuit device 10E is similar to that of the electronic circuit device 10, and the description regarding the similar part is omitted.

The electronic circuit device 10E includes the plane conductor 50E. The plane conductor 50E has a devoid-of-conductor part 500E. Because the plane conductor 50E includes the devoid-of-conductor part 500E, for example, it becomes possible to arrange another wiring pattern. Accordingly, the electronic circuit device 10E can improve flexibility in layout of various kinds of the wiring patterns within the wiring layer.

Note that as illustrated in FIG. 8, it is suitable that the devoid-of-conductor part 500E does not overlap the electronic fuse 22. According to this, the electronic circuit device 10E can ensure the suppression of the erroneous writing to the electronic fuse 22 and/or the corruption of data written to the electronic fuse 22.

Further, the shape of the devoid-of-conductor part 500E is not limited to the one illustrated in FIG. 8. For example, the plane conductor 50E may have a net-like shape and have a plurality of the devoid-of-conductor parts 500E arranged in a regular manner or in a random manner.

Note that constituent elements of the foregoing embodiments and constituent elements of derived examples can be combined if appropriate, and functions and effects associated with each combination can be produced.

REFERENCE SIGNS LIST 10, 10A, 10B, 10C, 10D, 10E Electronic circuit device
20 IC control unit
21 Digital IO
22 Electronic fuse
23 Level converter
31, 32 Switch circuit
40 Amplifier circuit
50, 50B, 50C, 50D, 50E Plane conductor
61 Wiring conductor
71, 71B Wiring conductor
72 Interlayer connection conductor
73 Pad conductor for external connection
81 Conductor for connection
82 Interlayer connection conductor
100 Semiconductor substrate 101 Support part
102 Embedded oxide layer
110, 110A Wiring layer
111, 112, 113, 114, 115 Insulator layer
190 Insulating resist film
221 Control unit
222 Fuse memory
500 Devoid-of-conductor part
500E Devoid-of-conductor part
600, 600G, 601, 602, 603 External connection terminal
621, 622 Interlayer connection conductor
F100 Surface
F110 Outside surface

The invention claimed is:

1. An electronic circuit device, comprising:
a semiconductor substrate;
a wiring layer on a surface of the semiconductor substrate; and
an external connection terminal on an outside surface of the wiring layer opposite the semiconductor substrate,
wherein the semiconductor substrate comprises:
a memory that is a write-once memory,
a controller configured to write and read data to and from the memory, and
a communication controller configured to control external data communication with the controller,
wherein the wiring layer comprises:
a first wiring conductor that connects the communication controller and the external connection terminal, and
a plane conductor between the first wiring conductor and the surface of the semiconductor substrate,
wherein the first wiring conductor overlaps the memory in a plan view of the semiconductor substrate, and
wherein the plane conductor is between the first wiring conductor and the memory, and is connected to a fixed electrical potential.

2. The electronic circuit device according to claim 1, further comprising:
a connection conductor that connects the memory and the controller,
wherein the plane conductor is between the first wiring conductor and the connection conductor.

3. The electronic circuit device according to claim 1, wherein the plane conductor is between the first wiring conductor and the controller.

4. The electronic circuit device according to claim 1,
wherein the wiring layer comprises a second wiring conductor connected to the controller,
wherein in a stacking direction of the electronic circuit device, the second wiring conductor is closer to the surface of the semiconductor substrate than the plane conductor, and
wherein the plane conductor is between the first wiring conductor and the second wiring conductor.

5. The electronic circuit device according to claim 1, wherein the fixed electrical potential is a ground potential.

6. The electronic circuit device according to claim 1, wherein the plane conductor comprises a portion that is not electrically conductive.

7. The electronic circuit device according to claim 1, wherein the plane conductor is entirely electrically conductive.

8. The electronic circuit device according to claim 1,
wherein the semiconductor substrate comprises a radio frequency (RF) signal processor that is connected to the controller, and that is configured to process RF signals based on an output from the controller, and
wherein the RF signal processor comprises a low noise amplifier, and is in or on the semiconductor substrate at a location that is different from locations of the memory, the controller, and the communication controller.

9. The electronic circuit device according to claim 8, wherein the external connection terminal and the first wiring conductor do not overlap the low noise amplifier in the plan view.

10. The electronic circuit device according to claim 1, wherein the plane conductor is thicker than the first wiring conductor, the first wiring conductor overlapping the plane conductor in the plan view.

11. The electronic circuit device according to claim 1, wherein the first wiring conductor is closer to the outside surface than to the surface of the semiconductor substrate in a stacking direction of the electronic circuit device.

12. The electronic circuit device according to claim 1,
wherein the wiring layer comprises a first wiring layer that is closer to the surface of the semiconductor substrate than to the outside surface, and a second wiring layer that is closer to the outside surface than to the surface of the semiconductor substrate, and
wherein the plane conductor is in the second wiring layer.

13. The electronic circuit device according to claim 12,
wherein a second insulator layer of the second wiring layer is thicker than a first insulator layer of the first wiring layer, and
wherein the plane conductor is at an intermediate location of the second wiring layer in a stacking direction of the electronic circuit device.

14. The electronic circuit device according to claim 1, wherein the semiconductor substrate is a silicon substrate.

15. An electronic circuit device, comprising:
a semiconductor substrate;
a wiring layer on a surface of the semiconductor substrate; and
an external connection terminal on an outside surface of the wiring layer opposite the semiconductor substrate,
wherein the semiconductor substrate comprises:
a memory that is a write-once memory,
a controller configured to write and read data to and from the memory, and
a communication controller configured to control external data communication with the controller,
wherein the wiring layer comprises:
a first wiring conductor that connects the communication controller and the external connection terminal,
a plane conductor between the first wiring conductor and the surface of the semiconductor substrate, and
a connection conductor that connects the memory and the controller,
wherein the first wiring conductor overlaps the memory in a plan view of the semiconductor substrate, and
wherein the plane conductor is between the first wiring conductor and the connection conductor, and is connected to a fixed electrical potential.

* * * * *